United States Patent
Sivasankar et al.

(10) Patent No.: US 11,047,890 B2
(45) Date of Patent: Jun. 29, 2021

(54) MINIMIZING PHASE MISMATCH AND OFFSET SENSITIVITY IN A DUAL-PATH SYSTEM

(71) Applicant: Cirrus Logic International Semiconductor Ltd., Edinburgh (GB)

(72) Inventors: Gautham S. Sivasankar, Austin, TX (US); Tejasvi Das, Austin, TX (US); Emmanuel Marchais, Dripping Springs, TX (US); Amar Vellanki, Cedar Park, TX (US); Leyi Yin, Austin, TX (US); John L. Melanson, Austin, TX (US); Venugopal Choukinishi, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 295 days.

(21) Appl. No.: 16/121,259

(22) Filed: Sep. 4, 2018

(65) Prior Publication Data
US 2019/0257866 A1 Aug. 22, 2019

Related U.S. Application Data

(60) Provisional application No. 62/632,018, filed on Feb. 19, 2018, provisional application No. 62/632,293, filed on Feb. 19, 2018.

(51) Int. Cl.
*G01R 25/00* (2006.01)
*H03D 13/00* (2006.01)
(Continued)

(52) U.S. Cl.
CPC .......... *G01R 25/005* (2013.01); *G01R 19/04* (2013.01); *G01R 19/2513* (2013.01);
(Continued)

(58) Field of Classification Search
CPC .. G01R 25/00; G01R 25/005; G01R 19/2513; G01R 21/133; G01R 29/18;
(Continued)

(56) References Cited

U.S. PATENT DOCUMENTS

| 2006/0103458 A1* | 5/2006 | Hansen | ..................... H03F 3/68 330/10 |
| 2009/0160552 A1* | 6/2009 | Vainsencher | ........... H03F 3/217 330/251 |

(Continued)

*Primary Examiner* — Raul J Rios Russo
(74) *Attorney, Agent, or Firm* — Jackson Walker L.L.P.

(57) ABSTRACT

A method of determining a phase misalignment between a first signal generated from a first signal path and a second signal generated from a second signal path may include obtaining multiple samples of the first signal proximate to when the first signal crosses zero wherein the first signal can be approximated as linear; obtaining multiple samples of the second signal proximate to when the second signal crosses zero wherein the first signal can be approximated as linear; based on the multiple samples of the first signal, approximating a first time at which the first signal crosses zero; based on the multiple samples of the second signal, approximating a second time at which the second signal crosses zero; and determining the phase misalignment between the first signal and the second signal based on a difference between the first time and the second time.

15 Claims, 5 Drawing Sheets

(51) Int. Cl.
*H03F 3/183* (2006.01)
*H03G 3/30* (2006.01)
*H04R 3/00* (2006.01)
*H03G 3/00* (2006.01)
*G01R 19/25* (2006.01)
*G01R 21/133* (2006.01)
*G01R 29/18* (2006.01)
*G01R 31/317* (2006.01)
*G01R 31/30* (2006.01)
*G01R 19/04* (2006.01)

(52) U.S. Cl.
CPC ........... *G01R 21/133* (2013.01); *G01R 25/00* (2013.01); *G01R 29/18* (2013.01); *G01R 31/3016* (2013.01); *G01R 31/31725* (2013.01); *H03F 3/183* (2013.01); *H03G 3/002* (2013.01); *H03G 3/3005* (2013.01); *H04R 3/00* (2013.01); *H03F 2200/03* (2013.01); *H03G 2201/103* (2013.01)

(58) Field of Classification Search
CPC .......... G01R 31/31725; G01R 31/3016; G01R 19/04; G01R 19/25; G01R 19/175; H03F 3/183; H03F 2200/03; H03F 2200/351; H03F 3/217; H03G 3/3005; H03G 3/002; H03G 2201/103; H04R 3/00
See application file for complete search history.

(56) References Cited

U.S. PATENT DOCUMENTS

| | | | |
|---|---|---|---|
| 2012/0323517 A1* | 12/2012 | Pado | G01N 29/326 702/104 |
| 2013/0088294 A1* | 4/2013 | Heineman | H03F 3/185 330/207 A |
| 2013/0168534 A1* | 7/2013 | Burr | G01T 1/1647 250/208.2 |
| 2014/0112500 A1* | 4/2014 | Lesso | H03K 3/013 381/121 |
| 2019/0253031 A1* | 8/2019 | Vellanki | H03F 3/217 |

\* cited by examiner

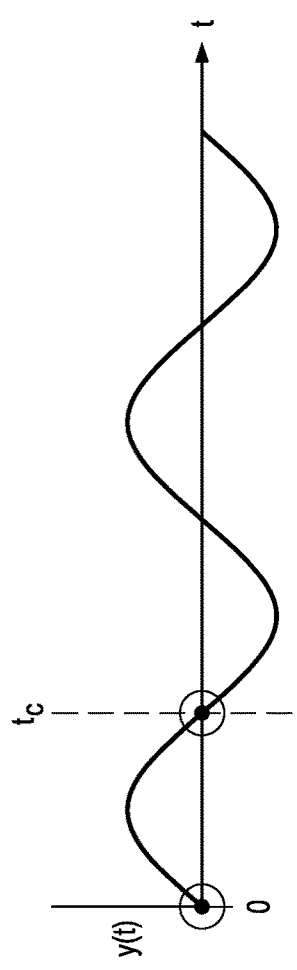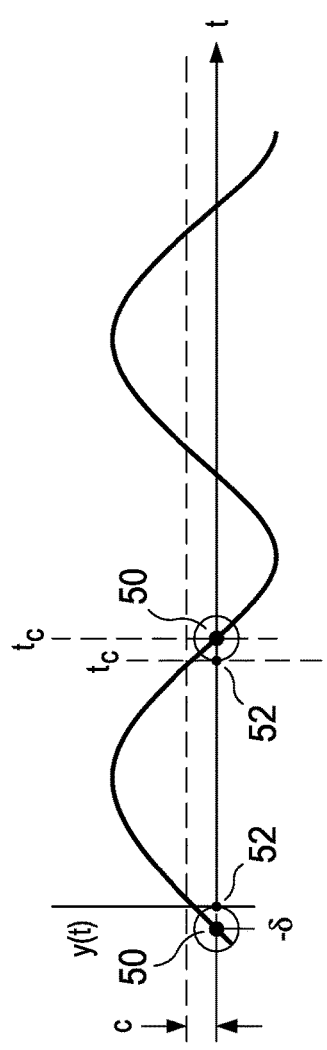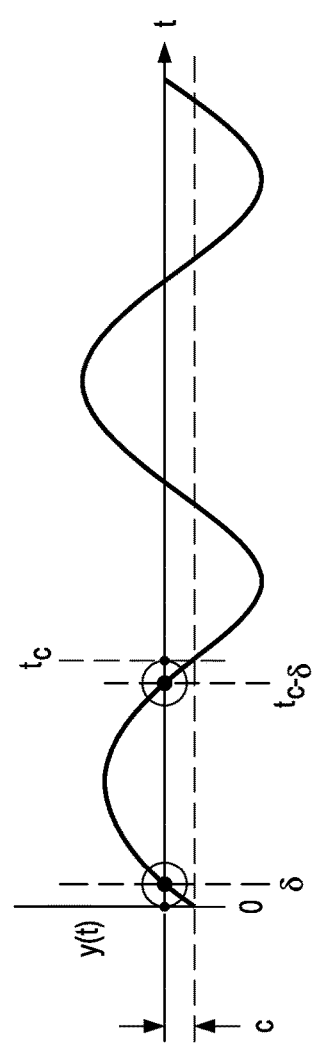

MINIMIZING PHASE MISMATCH AND OFFSET SENSITIVITY IN A DUAL-PATH SYSTEM

RELATED APPLICATIONS

The present disclosure claims priority to U.S. Provisional Patent Application Ser. No. 62/632,018, filed Feb. 19, 2018 and U.S. Provisional Patent Application Ser. 62/632,293, filed Feb. 19, 2018, each of which is incorporated by reference herein in its entirety.

FIELD OF DISCLOSURE

The present disclosure relates in general to circuits for audio and haptic devices, including without limitation personal audio devices, such as wireless telephones and media players, or devices comprising a haptic module.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers. Generally speaking, a power amplifier amplifies an audio signal by taking energy from a power supply and controlling an audio output signal to match an input signal shape but with a larger amplitude.

One example of an audio amplifier is a class-D amplifier. A class-D amplifier (also known as a "switching amplifier") may comprise an electronic amplifier in which the amplifying devices (e.g., transistors, typically metal-oxide-semiconductor field effect transistors) operate as electronic switches. In a class-D amplifier, a signal to be amplified may be converted to a series of pulses by pulse-width modulation, pulse-density modulation, or another method of modulation, such that the signal is converted into a modulated signal in which a characteristic of the pulses of the modulated signal (e.g., pulse widths, pulse density, etc.) is a function of the magnitude of the signal. After amplification with a class-D amplifier, the output pulse train may be converted to an unmodulated analog signal by passing through a passive low-pass filter, wherein such low-pass filter may be inherent in the class-D amplifier or a load driven by the class-D amplifier. Class-D amplifiers are often used due to the fact that they may be more power efficient than linear analog amplifiers, in that class-D amplifiers may dissipate less power as heat in active devices as compared to linear analog amplifiers.

Typically, a closed-loop PWM amplifier is chosen in order to provide accurate load voltage with desirable Total Harmonic Distortion (THD) and Power Supply Rejection Ratio (PSRR). A closed-loop PWM amplifier typically takes an analog voltage input and a sensed feedback voltage signal which are fed through a closed-loop analog PWM modulator to drive voltage on the speaker load.

However, an option to alternatively drive loads using a single PWM amplifier circuit in either open-loop or closed-loop depending on the specific application may be desirable. When using such a single PWM amplifier circuit, it may be critical to calibrate for mismatches in gain between the two paths. However, phase mismatches between the two paths and direct current (DC) offsets between the two paths may lead to inaccurate gain calibration unless sensitivity of the gain calibration system to phase mismatches and DC offset is reduced or eliminated.

SUMMARY

In accordance with the teachings of the present disclosure, one or more disadvantages and problems associated with existing approaches to processing signals with an amplifier may be reduced or eliminated.

In accordance with embodiments of the present disclosure, a method of determining a phase misalignment between a first signal generated from a first signal path and a second signal generated from a second signal path may include obtaining multiple samples of the first signal proximate to when the first signal crosses zero wherein the first signal can be approximated as linear; obtaining multiple samples of the second signal proximate to when the second signal crosses zero wherein the first signal can be approximated as linear; based on the multiple samples of the first signal, approximating a first time at which the first signal crosses zero; based on the multiple samples of the second signal, approximating a second time at which the second signal crosses zero; and determining the phase misalignment between the first signal and the second signal based on a difference between the first time and the second time.

In accordance with these and other embodiments of the present disclosure, a method of determining a phase misalignment between a first signal generated from a first signal path and a second signal generated from a second signal path may include approximating a first time in which the first signal crosses zero; approximating a second time in which the second signal crosses zero; determining the phase misalignment between the first signal and the second signal based on a difference between the first time and the second time, wherein approximating the second time comprises approximating a rising zero cross time in which the second signal crosses zero while rising in value by interpolating between successive samples occurring before and after the second signal crosses zero while rising in value; approximating a falling zero cross time in which the second signal crosses zero while falling in value by interpolating between successive samples occurring before and after the second signal crosses zero while falling in value; and determining the second time based on the rising zero cross time and the falling zero cross time such that a difference between the first time and the second time is substantially unaffected by a difference in offset between the first signal and the second signal.

In accordance with these and other embodiments of the present disclosure, a method for calculating a relative gain between a first signal generated from a first signal path and second signal generated from a second signal path may include applying a time-based weighting function to the first signal within a fixed time window to generate a weighted first signal, applying the time-based weighting function to the second signal within the fixed time window to generate a weighted second signal, and calculating the relative gain based on a first signal energy of the weighted first signal in the fixed time window and a second signal energy of the second weighted signal in the fixed time window.

In accordance with these and other embodiments of the present disclosure, a method for calculating a relative gain between a first signal generated from a first signal path and a second signal generated from a second signal path may include using a correlation function of the first signal and the second signal to compute the gain such that the gain is substantially unaffected by a difference in offset between the first signal and the second signal.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 5A illustrates a graph of a reference signal without a DC offset, in accordance with embodiments of the present disclosure;

FIG. 5B illustrates a graph of a reference signal with a positive DC offset, in accordance with embodiments of the present disclosure;

FIG. 5C illustrates a graph of a reference signal with a negative DC offset, in accordance with embodiments of the present disclosure.

DETAILED DESCRIPTION

Figure 1:
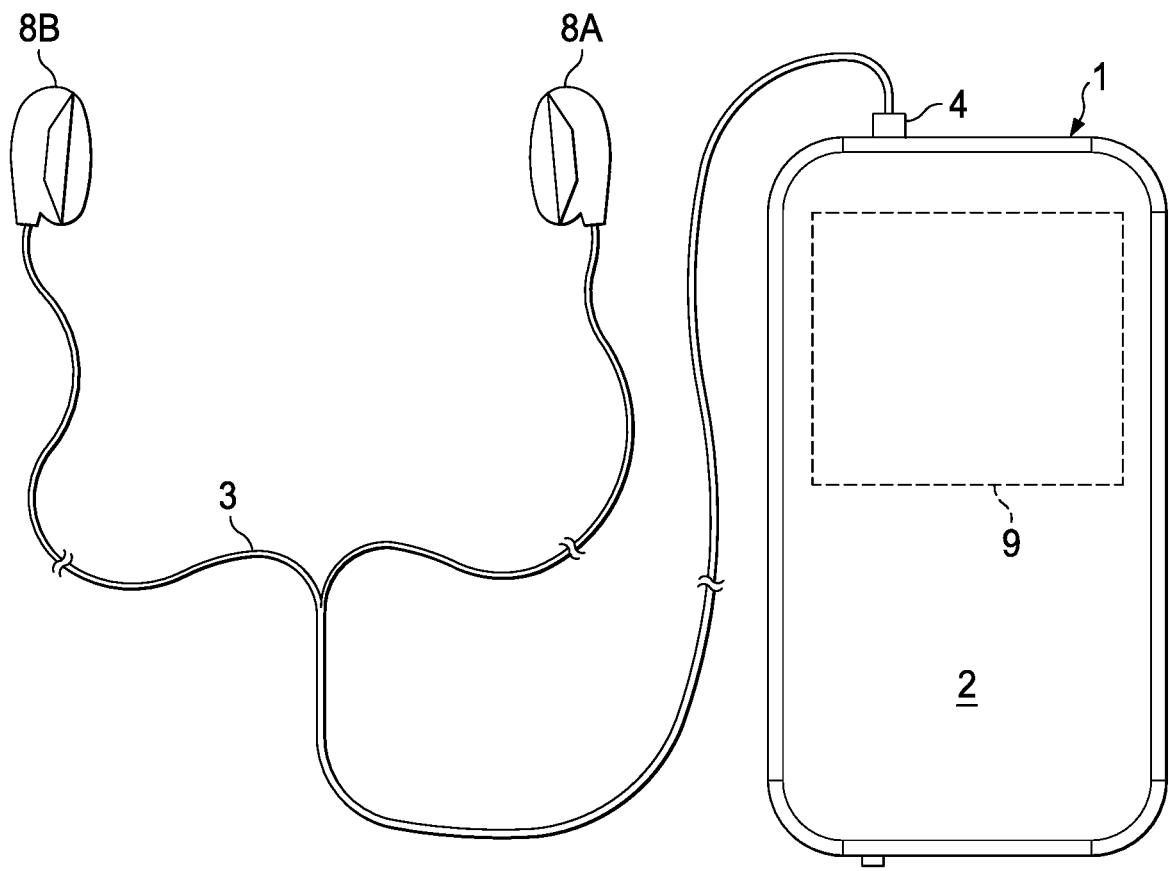
FIG. 1 is an illustration of an example personal audio device, in accordance with embodiments of the present disclosure.

FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer (e.g., a loudspeaker).

Figure 2:
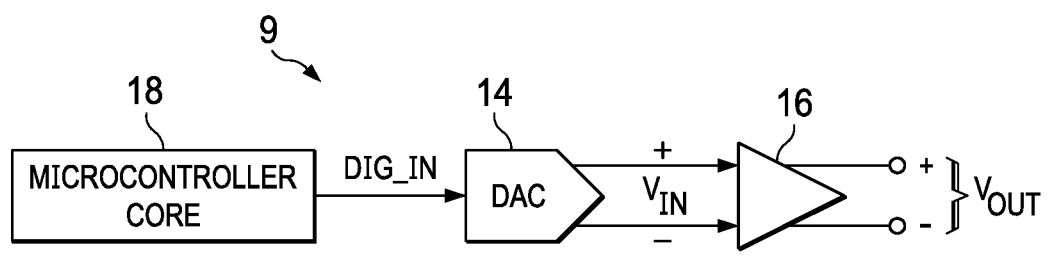
FIG. 2 is a block diagram of selected components of an example audio integrated circuit of a personal audio device, in accordance with embodiments of the present disclosure.

FIG. 2 is a block diagram of selected components of an example audio IC 9 of a personal audio device, in accordance with embodiments of the present disclosure. In some embodiments, example audio IC 9 may be used to implement audio IC 9 of FIG. 1. As shown in FIG. 2, a microcontroller core 18 (e.g., a digital signal processor or "DSP") may supply a digital audio input signal DIG_IN to a digital-to-analog converter (DAC) 14, which may convert the digital audio input signal to an analog input signal $V_{IN}$. DAC 14 may supply analog signal $V_{IN}$ to an amplifier 16 which may amplify or attenuate analog input signal $V_{IN}$ to provide an audio output signal $V_{OUT}$, which may operate a speaker, headphone transducer, a line level signal output, and/or other suitable output.

Figure 3A:
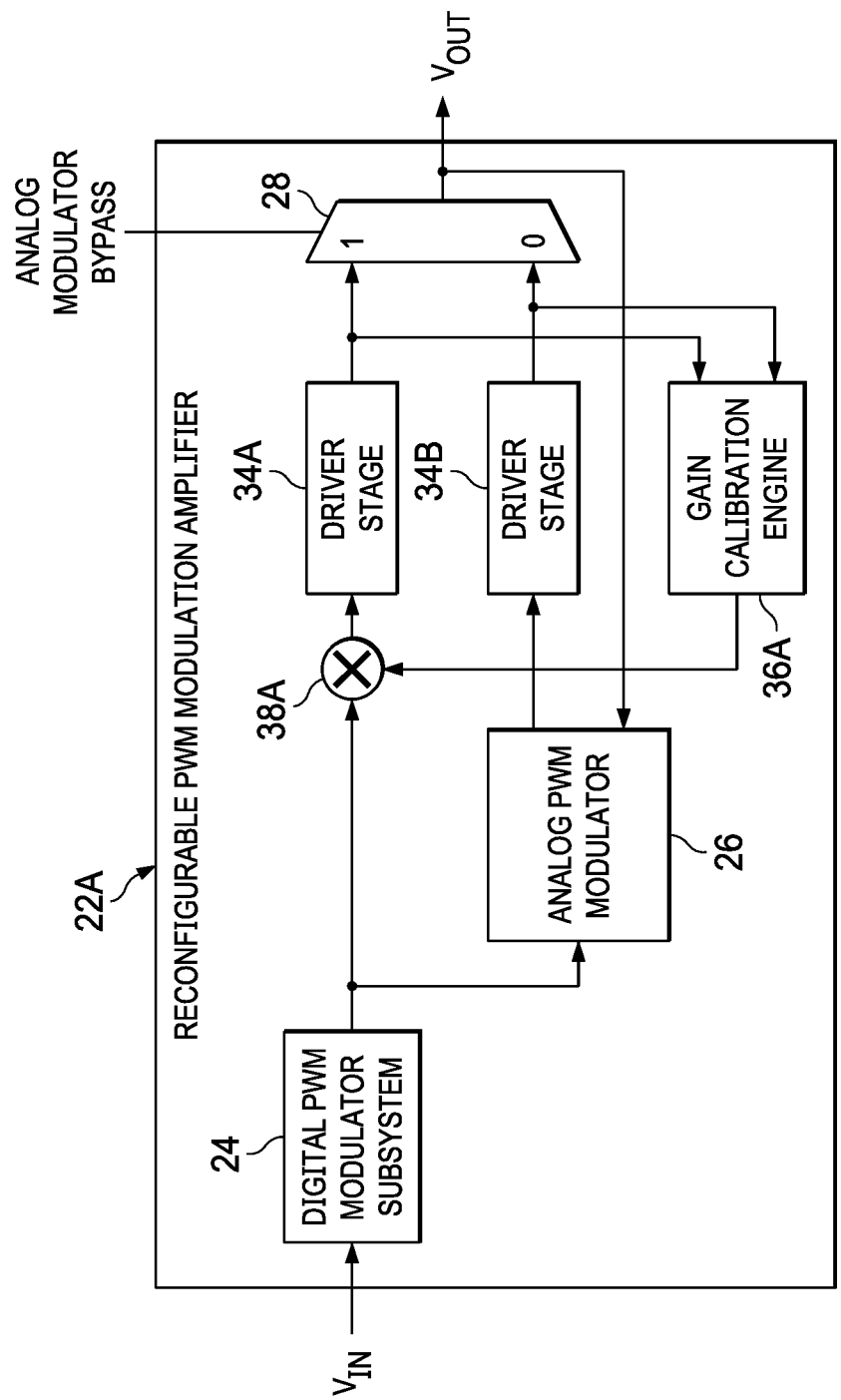
FIG. 3A is a block diagram of selected components of an example pulse width modulation amplifier, in accordance with embodiments of the present disclosure.

FIG. 3A is a block diagram of selected components of an example reconfigurable pulse width modulation amplifier 22A, in accordance with embodiments of the present disclosure. In some embodiments, reconfigurable example pulse width modulation amplifier 22A may be used to implement amplifier 16 of FIG. 2. As shown in FIG. 3A, example reconfigurable pulse width modulation amplifier 22A may include a digital PWM modulator subsystem 24 and an analog PWM modulator 26, along with a direct bypass function implemented with a multiplexer 28.

Reconfigurable PWM modulation amplifier 22A may be configured to operate in an analog closed-loop mode through the use of analog PWM modulator 26 when the ANALOG MODULATOR BYPASS control signal received by multiplexer 28 is deasserted. In the analog closed-loop mode, input signal $V_{IN}$ may be modulated by digital PWM modulator subsystem 24, analog PWM modulator 26 may receive its input from digital PWM modulator subsystem 24, and analog PWM modulator 26 may be utilized such that the output of analog PWM modulator 26, as received and driven by driver stage 34B, is driven as output signal $V_{OUT}$. Driver stage 34B may comprise a plurality of output switches configured to generate output signal $V_{OUT}$ from a modulated signal generated by analog PWM modulator 26.

Reconfigurable PWM modulation amplifier 22A may also be configured to operate in a digital open-loop mode through the use of digital PWM modulator subsystem 24 when the ANALOG MODULATOR BYPASS control signal received by multiplexer 28 is asserted. In the digital open-loop mode, analog PWM modulator 26 and a driver stage 34B driven by analog PWM modulator 26 may be bypassed by multiplexer 28, and digital PWM modulator subsystem 24 may be utilized such that input signal $V_{IN}$ is modulated by digital PWM modulator subsystem 24 and the output of digital PWM modulator subsystem 24, as received and driven by an open-loop driver stage 34A, is driven as output signal $V_{OUT}$. Driver stage 34A may comprise a plurality of output switches configured to generate output signal $V_{OUT}$ from a modulated signal generated by digital PWM modulator subsystem 24.

Changing reconfigurable PWM modulation amplifier 22A from the analog closed-loop mode and the digital open-loop mode (and vice versa) may be achieved by, through use of multiplexer 28, selecting which of driver stage 34A and driver stage 34B is to drive output signal $V_{OUT}$.

In some embodiments, a control circuit (not shown) may be used to control multiplexer 28 in order to select a signal processing path for reconfigurable PWM modulation amplifier 22A. For example, selection of such multiplexer control signal may be based on one or more characteristics of input signal $V_{IN}$ to the amplifier (e.g., magnitude, frequency, or other characteristic of input signal $V_{IN}$). Thus, reconfigurable PWM modulation amplifier 22A may comprise a digital pulse width modulator subsystem (e.g., digital PWM modulator subsystem 24), a first path coupled to an output of the digital pulse width modulator subsystem and configured to drive an open-loop driver stage (e.g., driver stage 34A), and a second path coupled to the output of the digital pulse width modulator subsystem and configured to drive a closed-loop analog pulse width modulator (e.g., analog PWM modulator 26), wherein one of the first path and the second path is selected for processing a signal based on one or more characteristics of the signal.

Also as shown in FIG. 3A, reconfigurable PWM modulation amplifier 22A may also include a gain calibration engine 36A configured to detect a first output signal generated by driver stage 34A, detect a second output signal generated by driver stage 34B, and based on the two signals, calculate a gain compensation to be applied to a gain element 38A to compensate for the differences in signal gain between the signal path comprising driver stage 34A and the signal path comprising driver stage 34B. Thus, in reconfigurable PWM modulation amplifier 22A, gain calibration engine 36A may perform gain compensation on two forward signal paths (e.g., the signal path comprising driver stage 34A and the signal path comprising driver stage 34B) to compensate in differences between the two signal paths.

As noted in the Background section of this disclosure, accurate calculation of differences between the first output signal generated by driver stage 34A and the second output signal generated by driver stage 34B may be affected by a phase mismatch and/or a DC offset between the first signal and the second signal. Accordingly, as described in greater detail below, gain calibration engine 36A may also be configured to reduce or eliminate sensitivity to phase mismatch and/or DC offset in order to calculate an accurate gain compensation.

Figure 3B:
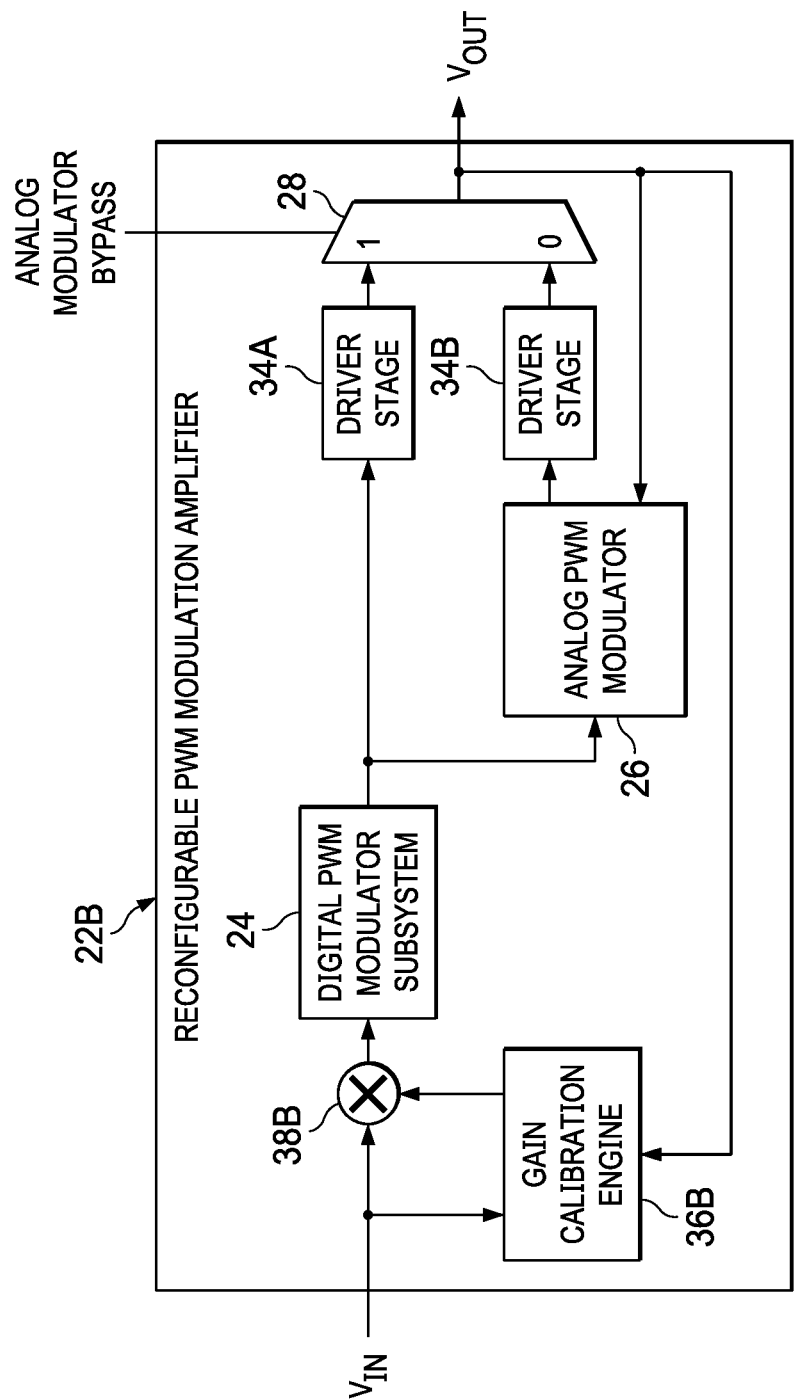
FIG. 3B is a block diagram of selected components of another example pulse width modulation amplifier, in accordance with embodiments of the present disclosure.

FIG. 3B is a block diagram of selected components of an example reconfigurable pulse width modulation amplifier 22B, in accordance with embodiments of the present disclosure. In some embodiments, example pulse width modulation amplifier 22B may be used to implement amplifier 16 of FIG. 2. Reconfigurable pulse width modulation amplifier 22B of FIG. 3B may be similar in many material respects to reconfigurable pulse width modulation amplifier 22A of FIG. 3A, with differences as noted below. The main difference between reconfigurable pulse width modulation amplifier 22A and reconfigurable pulse width modulation amplifier 22B is that in lieu of gain calibration engine 36A and gain element 38A present in reconfigurable pulse width modulation amplifier 22A, reconfigurable pulse width modulation amplifier 22B comprises a gain calibration engine 36B and a gain element 38B.

Gain calibration engine 36B may be configured to detect output signal $V_{OUT}$, detect input signal $V_{IN}$, and based on the two signals, calculate a gain compensation to be applied to input signal $V_{IN}$ via gain element 38B to compensate reconfigurable pulse width modulation amplifier 22B in a manner such that a desired amplifier gain is maintained for reconfigurable pulse width modulation amplifier 22B (e.g., maintains desired gain in the presence of process differences, temperature effects, aging effects, and/or other causes for variation in amplifier gain). Thus, in reconfigurable PWM modulation amplifier 22B, gain calibration engine 36B may perform gain compensation on a forward signal path (e.g., the signal path generating output voltage $V_{OUT}$) and a reverse calibration path or feedback path to perform compensation based on differences between the two signal paths.

As noted in the Background section of this disclosure, accurate calculation of differences between output signal $V_{OUT}$ and input signal $V_{IN}$ may be affected by a phase mismatch and/or a DC offset between output signal $V_{OUT}$ and input signal $V_{IN}$. Accordingly, as described in greater detail below, gain calibration engine 36B may also be configured to reduce or eliminate sensitivity to phase mismatch and/or DC offset in order to calculate an accurate gain compensation.

Although FIGS. 3A and 3B suggest gain calibration engine 36A and gain calibration engine 36B as alternatives to each other, in certain embodiments of the present disclosure, a reconfigurable pulse width modulation amplifier may include both of gain calibration engine 36A and gain calibration engine 36B, or a single gain calibration engine that performs the functions of both of gain calibration engine 36A and gain calibration engine 36B. For purposes of clarity and exposition, gain calibration engine 36A and gain calibration engine 36B may be referred to hereinafter individually as a gain calibration engine 36 or collectively as gain calibration engine 36.

In order to detect a phase mismatch between two signals to be calibrated to one another, a gain calibration engine 36 may determine a respective time in which each signal crosses zero, with the difference in times of the zero crossing representing a phase delay between the two signals expressed in the time domain. Thus, to accurately calculate a gain compensation, gain calibration engine 36 may apply a time shift to one of the signals to compensate for the phase difference, then calculate a gain compensation based on the phase-aligned, phase-corrected signals. However, because the two signals at issue may be digital signals represented by discrete digital samples, the time of a zero crossing of a signal may not be exactly determined, unless one of the digital samples was obtained at the exact zero crossing. To overcome this issue, a gain calibration engine 36 may approximate a time at which a zero crossing occurs by interpolating between one or more samples occurring before the zero crossing and one or more samples occurring after the zero crossing.

Figure 4:
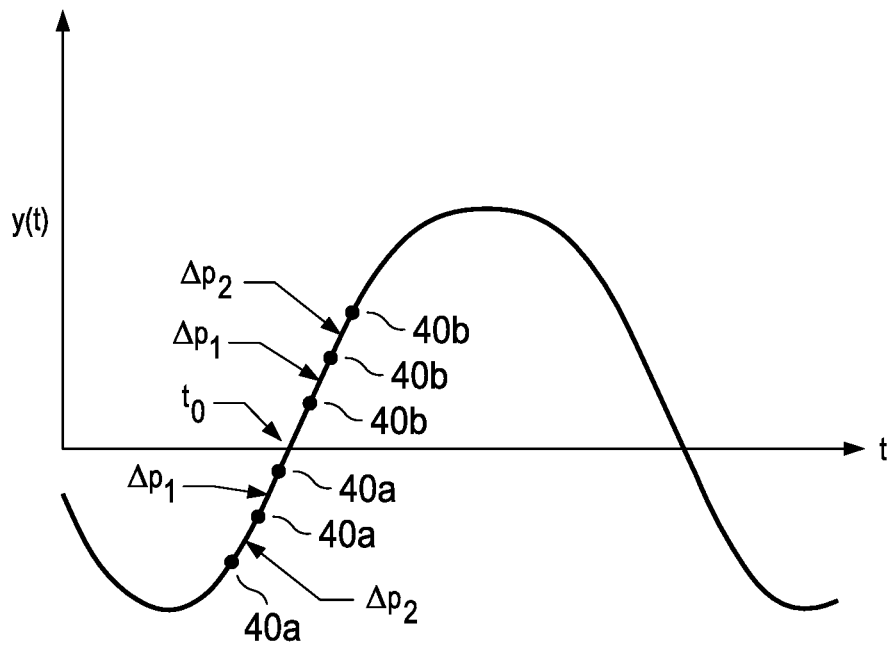
FIG. 4 illustrates a graph of a reference signal depicting sampling of the reference signal for approximating a zero crossing of the reference signal, in accordance with embodiments of the present disclosure.

An example of such interpolation is described by reference to FIG. 4. In operation, to determine a time $t_0$ of a zero crossing of a continuous-time reference signal y(t) represented by digital samples of reference signal y(t), gain calibration engine 36 may obtain multiple samples 40a and 40b (which may be referred to individually as a sample 40 or collectively as samples 40) proximate to time $t_0$ such that reference signal y(t) may be approximated as linear in such region proximate to time $t_0$ (e.g., based on the principle that for a sinusoidal signal, for small values of x, sin x≈x), and calculate the zero crossing time of reference signal y(t) based on these samples, as described in greater detail below. A gain calibration engine 36 may calculate the respective zero-crossing time $t_0$ of two different signals in such manner, and then calculate a phase misalignment based on a difference in time of the zero crossing of the two signals.

In some embodiments, such interpolation may be performed by taking an average of the amplitude difference or delta (e.g., average of $\Delta n_1$, $\Delta n_2$, etc.) between successive samples 40a occurring when reference signal y(t) is less than zero and the average of the amplitude difference (e.g., average of $\Delta p_1$, $\Delta p_2$, etc.) between successive samples 40b occurring when reference signal y(t) is greater than zero. Although FIG. 4 depicts the use of only two samples below zero and two samples above zero for purposes of clarity and exposition, any suitable number of samples occurring in the approximately linear region of reference signal y(t) may be used. Stated another way, for each pair of successive samples 40b in which reference signal y(t) is greater than zero, gain calibration engine 36 may calculate a respective above-zero delta (e.g., $\Delta p_1, \Delta p_2, \ldots, \Delta p_N$) for such pair of successive samples, each respective above-zero delta comprising an amplitude difference of the reference signal y(t) in the pair of successive samples used to calculate the respective above-zero delta. Similarly, for each pair of successive samples 40a in which reference signal y(t) is less than zero, the gain calibration engine 36 may calculate a respective below-zero delta (e.g., $\Delta n_1, \Delta n_2, \ldots, \Delta n_N$) for such pair of successive samples, and each respective below-zero delta comprises an amplitude difference of the reference signal y(t) in the pair of successive samples used to calculate the respective below-zero delta. Having calculated the various deltas, the gain calibration engine 36 may interpolate to determine the first time based on an average of the respective above-zero deltas and an average of the respective below-zero deltas.

A time $t_0$ at which a zero cross occurs in reference signal y(t) may be computed by:

$$t_0 = t_1 - \frac{\Delta}{F_s N}$$

Where $t_1$ is the time occurrence of the first sample immediately after the zero cross of reference signal y(t) (e.g., $y_{p1}$(t)), $\Delta$ is the phase delay from time $t_0$ to $t_1$ expressed in terms of a resolution factor N, and $F_s$ is the sampling frequency for reference signal y(t).

The delta phase delay $\Delta$ may be given by:

$$\Delta = \frac{y_{P1}(t)}{AIR}$$

As expressed in terms of resolution factor N, where AIR is an "averaged interpolation range" described in further detail below. The resolution factor N may be given as a multiple of the sampling frequency $F_s$ needed for desired accuracy. For example, if a phase estimate is needed in terms of 3 MHz and the sampling frequency for the system is 750 KHz, then N=3 MHz/750 KHz=4.

Stated computationally, the averaged interpolation range AIR may be computed as:

$$AIR = \frac{1}{2}\left[\frac{\sum_{i=1}^{n}(y_{p_{i+1}} - y_{p_i})}{n} + \frac{\sum_{i=1}^{n}(y_{n_{i+1}} - y_{n_i})}{n}\right]$$

or alternatively:

$$AIR = \frac{1}{2}\left[\frac{\sum_{i=1}^{n}(\Delta_{p_{i+1}} - \Delta_{p_i})}{n} + \frac{\sum_{i=1}^{n}(\Delta_{n_{i+1}} - \Delta_{n_i})}{n}\right]$$

In instances in which a DC offset exists between two signals, the presence of DC offset may lead to inaccuracy in the calculation of phase misalignment. For example, in the absence of DC offset, as shown in FIG. 5A, a reference signal y(t) may cross zero on its rising edge at a time 0 and cross zero on its falling edge at time $t_c$ (or vice versa). However, as shown in FIG. 5B, the same reference signal y(t) with a positive DC offset of C may have detected zero crossings 50 for rising edges that occur a time $\delta$ earlier (e.g., at a time $-\delta$) than the actual zero crossing 52 that would occur in the absence of DC offset and may have detected zero crossings 50 for falling edges of reference signal y(t) occur later (e.g., at a time $t_c+\delta$) than the actual zero crossing 52 that would occur in the absence of DC offset. Similarly, as shown in FIG. 5C, the same reference signal y(t) with a negative DC offset of C may have detected zero crossings 50 for rising edges that occur a time $\delta$ later (e.g., at a time $\delta$) than the actual zero crossing 52 that would occur in the absence of DC offset and may have detected zero crossings 50 for falling edges of reference signal y(t) occurring earlier (e.g., at a time $t_c-\delta$) than the actual zero crossing 52 that would occur in the absence of DC offset.

A gain calibration engine 36 may compensate for such DC offset by approximating a rising zero cross time in which a reference signal y(t) crosses zero while rising in value by interpolating between successive samples occurring before and after the reference signal y(t) crosses zero while rising in value, and also approximating a falling zero cross time in which the reference signal y(t) crosses zero while falling in value by interpolating between successive samples occurring before and after the reference signal y(t) crosses zero while falling in value. The gain calibration engine 36 may then average the rising zero cross time and the falling zero cross time, which may cancel the time difference $\delta$ between actual and detected zero cross times introduced by DC offset leaving a value equal to the time (e.g., $t_c$ in FIGS. 5A-5C) between zero crossings of the reference signal y(t), from which the times of actual zero crossings of the reference signal y(t) may be determined.

As contemplated above, as a phase misalignment between two signals increases, accuracy in the calculation of a gain compensation to equalize the gains of the two signals may decrease. This is particularly true when gain calculation is performed by measuring the respective signal energies of the two signals within a fixed time window, as characteristics of a first signal may occur within the fixed time window but such characteristics may be phase delayed in a second signal such that those characteristics in the second signal fall outside of the fixed time measurement window.

Figure 6:
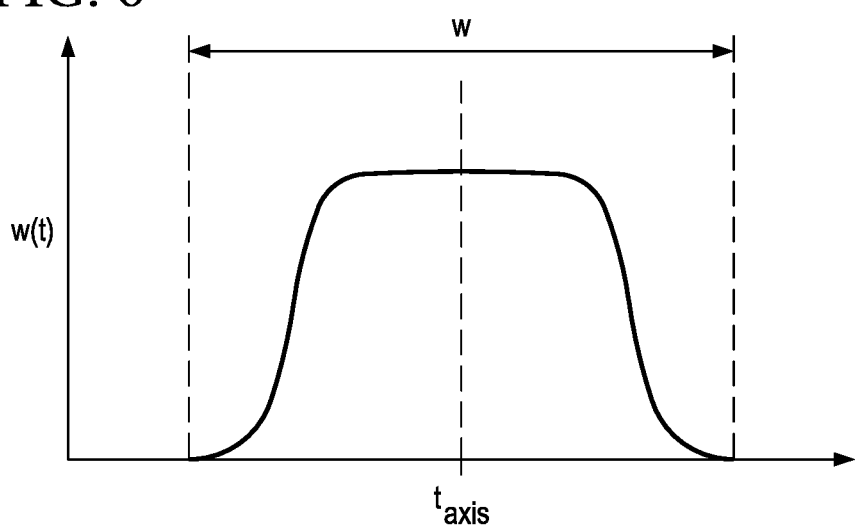
FIG. 6 illustrates a graph of a weighting function, in accordance with embodiments of the present disclosure.

To minimize this inaccuracy due to phase misalignment of signals, a gain calibration engine 36 may apply a time-based weighting function to each of a first signal and a second signal within a fixed time measurement window. FIG. 6 depicts an example time-based weighting function w(t) that may be applied to the signals within a fixed time window W. In operation, the gain calibration engine 36 may apply time-based weighting function w(t) to a first signal (e.g., x(t)) within fixed time window W to generate a weighted first signal (e.g., w(t)x(t)), apply time-based weighting function w(t) to a second signal (e.g., y(t)) within fixed time window W to generate a weighted first signal (e.g., w(t)y(t)), and calculate a relative gain based on a first signal energy of the weighted first signal in the fixed time window and a second signal energy of the second weighted signal in the fixed time window. From such calculated relative gain, gain calibration engine 36 may determine a gain compensation to apply to compensate for such relative gain. As shown in FIG. 6, in some embodiments weighting function w(t) may be symmetric about a reference time $t_{axis}$ defining an axis of symmetry for weighting function w(t), and weighting function w(t) may monotonically increase in amplitude as a function of time before reference time $t_{axis}$, and may monotonically decrease in amplitude as a function of time after the reference time $t_{axis}$. By having greater magnitude near reference time $t_{axis}$ and tapering off in magnitude towards the edges of fixed time window W, signal characteristics occurring within signals x(t) and y(t) near the edges of window W may be reduced in magnitude, reducing gain calculation inaccuracy for high-energy events that may occur near the edge of window W for one signal but fall outside window W for the other signal.

Although FIG. 6 shows a particular example weighting function w(t), any suitable weighting function may be used in accordance with embodiments of the present disclosure.

In addition to or in lieu of using one or more of the foregoing techniques, gain calibration engine 36 may also reduce computation inaccuracy due to DC offset by calculating a relative gain between a first signal (e.g., x(t)) generated from a first signal path and a second signal generated from a second signal path (e.g., y(t)) by using a correlation function of the first signal (e.g., E(x)) and the second signal (e.g., E(y)) to compute the gain such that the gain is substantially unaffected by a difference in offset between the first signal and the second signal. As used herein, a function E may represent an expected value, averaged value, estimated value, or some other value of the signal to which the function E is applied.

For example, in some embodiments, the relative gain may be computed by calculating a ratio of two polynomial combinations of the functions $E(x^2)$, $E(x)$, $E(xy)$, and $E(y)$. As a specific example, the relative gain may be computed by the correlation function $(E(xy)-E(x)E(y))/(E(x^2)-E(x)^2)$, such that a DC offset term present in first signal x(t) is cancelled out.

In these and other embodiments, a time-based weighting function, such as the time-based weighting function w(t) described above with respect to FIG. 6, may be applied to either of the first signal or the second signal to generate a corresponding weighted signal. Applying such weighting signal, the relative gain between first signal x(t) and second signal y(t) may be computed by calculating a ratio of two polynomial combinations of $E(wx^2)$, $E(x)$, $E(wxy)$, $E(xy)$, and $E(y)$, wherein w represents the weighting function. As a specific example, the relative gain may be computed by the correlation function $(E(wxy)-E(wx)E(y))/(E(wx^2)-E(wx)E(x))$, such that a DC offset term present in first signal x(t) is cancelled out and the weighting function reduces sensitivity to phase misalignment.

Although the foregoing contemplates use of reconfigurable PWM modulation amplifiers 22A and 22B for use in an audio amplifier for driving an audio transducer, it is understood that reconfigurable PWM modulation amplifiers 22A and 22B may be used in other types of amplifiers for driving other types of transducers, including without limitation an amplifier for driving a haptic transducer.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A method of determining a phase misalignment between a first signal generated from a first signal path and a second signal generated from a second signal path, comprising:
    obtaining multiple samples of the first signal proximate to when the first signal crosses zero wherein the first signal can be approximated as linear;
    obtaining multiple samples of the second signal proximate to when the second signal crosses zero wherein the first signal can be approximated as linear;
    based on the multiple samples of the first signal, approximating a first time at which the first signal crosses zero;
    based on the multiple samples of the second signal, approximating a second time at which the second signal crosses zero; and determining the phase misalignment between the first signal and the second signal based on a difference between the first time and the second time.

2. The method of claim 1, further comprising approximating the first time by:
   for each pair of successive samples of the multiple samples of the first signal in which the first signal is greater than zero, calculating a respective above-zero delta for such pair of successive samples, each respective above-zero delta comprising an amplitude difference of the first signal in the pair of successive samples used to calculate the respective above-zero delta;
   for each pair of successive samples of the multiple samples of the first signal in which the first signal is less than zero, calculating a respective below-zero delta for such pair of successive samples, each respective below-zero delta comprising an amplitude difference of the first signal in the pair of successive samples used to calculate the respective below-zero delta; and
   interpolating to determine the first time based on an average of the respective above-zero deltas and an average of the respective below-zero deltas.

3. The method of claim 2, wherein the first signal path is a reverse calibration path and the second signal path is a forward signal path.

4. The method of claim 2, wherein the first signal path and the second signal path are forward signal paths.

5. The method of claim 1, wherein the first signal path is a reverse calibration path and the second signal path is a forward signal path.

6. The method of claim 1, wherein the first signal path and the second signal path are forward signal paths.

7. A method of determining a phase misalignment between a first signal generated from a first signal path and a second signal generated from a second signal path, comprising:
   approximating a first time in which the first signal crosses zero;
   approximating a second time in which the second signal crosses zero, wherein approximating the second time comprises:
      approximating a rising zero cross time in which the second signal crosses zero while rising in value by interpolating between successive samples occurring before and after the second signal crosses zero while rising in value;
      approximating a falling zero cross time in which the second signal crosses zero while falling in value by interpolating between successive samples occurring before and after the second signal crosses zero while falling in value; and
      determining the second time based on the rising zero cross time and the falling zero cross time such that a difference between the first time and the second time is substantially unaffected by a difference in offset between the first signal and the second signal; and
   determining the phase misalignment between the first signal and the second signal based on a difference between the first time and the second time.

8. A method for calculating a relative gain between a first signal generated from a first signal path and a second signal generated from a second signal path, comprising:
   applying a time-based weighting function to the first signal within a fixed time window to generate a weighted first signal;
   applying the time-based weighting function to the second signal within the fixed time window to generate a weighted second signal; and
   calculating the relative gain based on a first signal energy of the weighted first signal in the fixed time window and a second signal energy of the second weighted signal in the fixed time window.

9. The method of claim 8, wherein the weighting function is symmetric about a reference time defining an axis of symmetry, monotonically increases in amplitude as a function of time before the reference time, and monotonically decreases in amplitude as a function of time after the reference time.

10. A method for calculating a relative gain between a first signal generated from a first signal path and a second signal generated from a second signal path, comprising:
   using a correlation function of the first signal and the second signal to compute the relative gain such that the relative gain is substantially unaffected by a difference in offset between the first signal and the second signal.

11. The method of claim 10, wherein the relative gain is computed by calculating a ratio of two polynomial combinations of $E(x^2)$, $E(x)$, $E(xy)$, and $E(y)$.

12. The method of claim 11, wherein the relative gain is computed by the correlation function $(E(xy)-E(x)E(y))/(E(x^2)\ E(x)^2)$.

13. The method of claim 10, further comprising:
   applying a time-based weighting function to the first signal within a fixed time window to generate a weighted first signal;
   applying the time-based weighting function to the second signal within the fixed time window to generate a weighted second signal; and
   wherein the correlation function uses at least one of the weighted first signal and the weighted second signal.

14. The method of claim 10, wherein the relative gain is computed by calculating a ratio of two polynomial combinations of $E(wx^y)$, $E(x)$, $E(wxy)$, $E(xy)$, and $E(y)$, wherein w represents the weighting function.

15. The method of claim 14, wherein the relative gain is computed by the correlation function $(E(wxy)-E(wx)E(y))/(E(wx^2)-E(wx)E(x))$.

* * * * *

UNITED STATES PATENT AND TRADEMARK OFFICE
CERTIFICATE OF CORRECTION

| | |
|---|---|
| PATENT NO. | : 11,047,890 B2 |
| APPLICATION NO. | : 16/121259 |
| DATED | : June 29, 2021 |
| INVENTOR(S) | : Sivasankar et al. |

It is certified that error appears in the above-identified patent and that said Letters Patent is hereby corrected as shown below:

In the Claims

1. In Column 12, Line 37, in Claim 12, delete "$(x^2) E(x)^2$)." and insert -- $(x^2)-E(x)^2$). --, therefor.

2. In Column 12, Line 49, in Claim 14, delete "$E(wx^y)$," and insert -- $E(wx^2)$, --, therefor.

Signed and Sealed this
Fifteenth Day of August, 2023

Katherine Kelly Vidal
*Director of the United States Patent and Trademark Office*